(12) United States Patent
Murphy

(10) Patent No.: US 7,546,101 B2
(45) Date of Patent: Jun. 9, 2009

(54) VARIABLE ATTENUATION OF BROADBAND DIFFERENTIAL SIGNALS USING PIN DIODES

(75) Inventor: William T. Murphy, Lawrenceville, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 462 days.

(21) Appl. No.: 11/406,538

(22) Filed: Apr. 19, 2006

(65) Prior Publication Data
US 2007/0249311 A1    Oct. 25, 2007

(51) Int. Cl.
*H04B 7/00* (2006.01)
(52) U.S. Cl. ............... 455/249.1; 455/136; 455/169.2; 455/180.4; 333/81 R; 333/254
(58) Field of Classification Search ............... 455/249.1, 455/136, 169.2, 180.4; 333/81 R, 254
See application file for complete search history.

(56) References Cited

U.S. PATENT DOCUMENTS

| 6,667,669 | B2 * | 12/2003 | Goyette et al. | 333/81 R |
| 6,973,288 | B1 * | 12/2005 | Davis et al. | 455/67.11 |
| 2005/0030121 | A1 * | 2/2005 | Gilbert | 333/81 R |
| 2006/0226907 | A1 * | 10/2006 | Gilbert | 330/254 |

FOREIGN PATENT DOCUMENTS

EP    1 351 382 A2    10/2003

* cited by examiner

*Primary Examiner*—Sanh D Phu
(74) *Attorney, Agent, or Firm*—Merchant & Gould

(57) ABSTRACT

Disclosed herein is a system for the variable attenuation of broadband differential signals. An exemplary system of variable attenuation of broadband differential signals includes attenuation devices arranged such that an attenuation device on the positive side of the differential signal has a corresponding attenuation device on the negative side of the differential signal with both of the corresponding attenuation devices on the same semiconductor die.

15 Claims, 8 Drawing Sheets

VARIABLE ATTENUATION OF BROADBAND DIFFERENTIAL SIGNALS USING PIN DIODES

TECHNICAL FIELD

The present disclosure is generally related to electronics and, more particularly, is related to a system and method for attenuating broadband differential signals.

BACKGROUND

Broadband data communication is used in many systems, including satellite, cable, and DSL systems. Increasingly, differential signaling is being used to transmit broadband communications in these systems. In transmitting a differential signal it is often desirable to control the output power of the differential signal. The output power is generally controlled using an attenuator circuit. A method for single-ended broadband variable attenuation is well-established in the industry. Therefore, one method of attenuating a differential signal would be to convert the differential signal to a single-ended signal, attenuate the single-ended signal, and then convert the single-ended signal back into a differential signal. The process of converting signals from differential to single ended and then reversing the process introduces several undesirable characteristics, including size, cost, insertion loss degradation, and frequency response degradation.

Thus, a heretofore unaddressed need exists in the industry to address the aforementioned deficiencies and inadequacies.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Disclosed herein is a system for the variable attenuation of broadband differential signals. To facilitate the description of the inventive system, an example system that can be used to implement the system for variable attenuation of broadband differential signals is discussed with reference to the figures. Although the system is described in detail, it will be appreciated that the system is provided for purposes of illustration only and that various modifications are feasible without departing from the inventive concept. After the example system has been described, an example of the operation of the system will be provided to explain the manner in which the system can be used to provide a variable attenuation of broadband differential signals.

Figure 1:
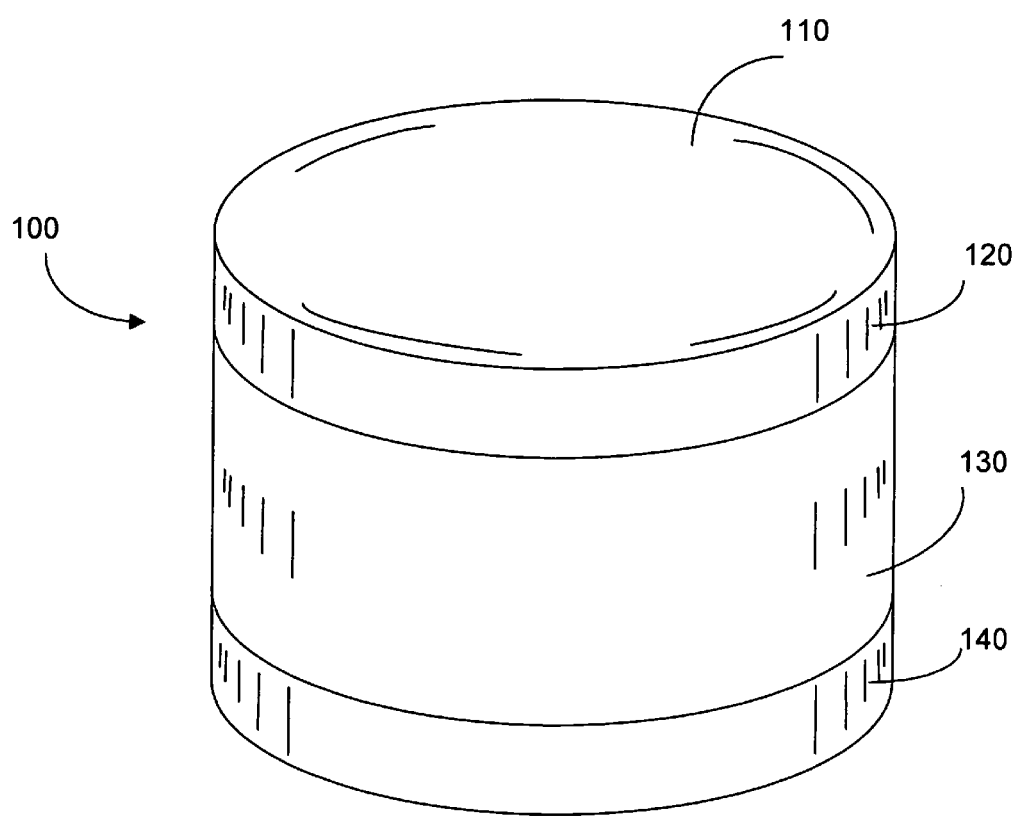
FIG. 1 is a perspective view of a PIN diode.

Referring now in more detail to the drawings in which like numerals indicate corresponding parts throughout the several views, FIG. 1 is a perspective view of a PIN diode. PIN diodes are useful in attenuation of a broadband signal due to their broadband impedance versus forward current. The PIN diode can be modeled as a current controlled resistor at broadband frequencies. It is a silicon semiconductor diode in which resistive intrinsic region 130 is sandwiched between p-type region 120 and n-type region 140. When PIN diode 100 is forward biased, holes and electrons are injected into I-region 130. These charges do not immediately annihilate each other; instead they stay alive for an average time called the carrier lifetime. This results in an average stored charge Q, which lowers the effective resistance of I-region 130 to a nominal source resistance.

When PIN diode 100 is at zero or reverse bias, there is no stored charge in I-region 130 and PIN diode 100 appears as high impedance in the form of a parasitic capacitor, shunted by a parallel parasitic resistance. By varying the width of insulator region 130 and diode area 110 it is possible to construct PIN diodes of different geometries to result in the different resistive characteristics. PIN diodes with different resistive characteristics are useful as switching elements to control radio frequency signals. In these applications, the PIN diode can be biased to either a high or low impedance device state depending on the level of stored charge in the insulator region.

Figure 2:
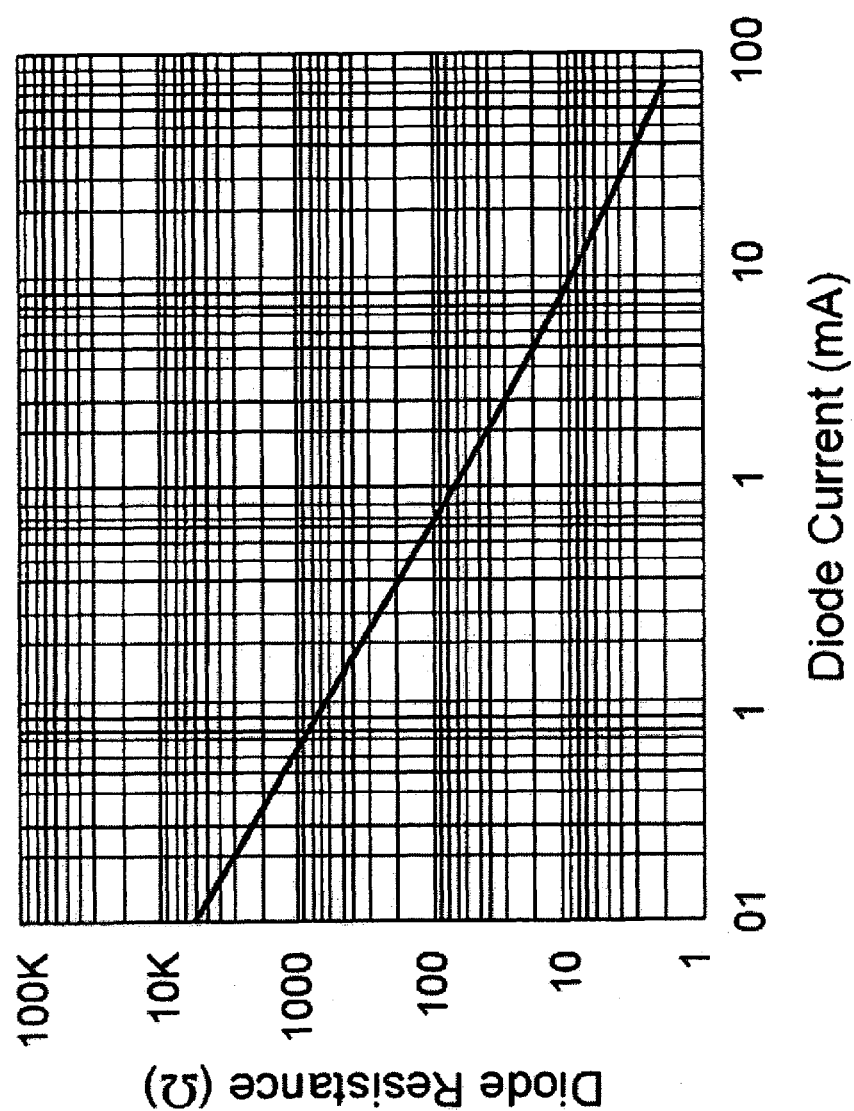
FIG. 2 is a graph of the resistance of the PIN diode versus the diode forward current of the PIN diode of FIG. 1.

FIG. 2 presents a graph of the resistance versus the forward current of a typical PIN diode for attenuator applications. This predictable, dependable relationship is utilized in attenuation circuits. To increase the resistance of the diode, the forward current of the diode is decreased. To decrease the resistance of the diode, the forward current of the diode is increased.

At least one embodiment of an attenuation circuit as disclosed herein may be used in a Gigabit Quadrature Amplitude Modulation (GQMA) radio frequency (RF) board in a head end unit of a broadband telecommunication system as a non-limiting example. The circuit may be utilized on the GQAM RF board to set the amplitude of the signal to be transmitted from a head end device to a client device. One of ordinary skill in the art would appreciate other uses for at least one of the embodiments disclosed herein.

Figure 3:
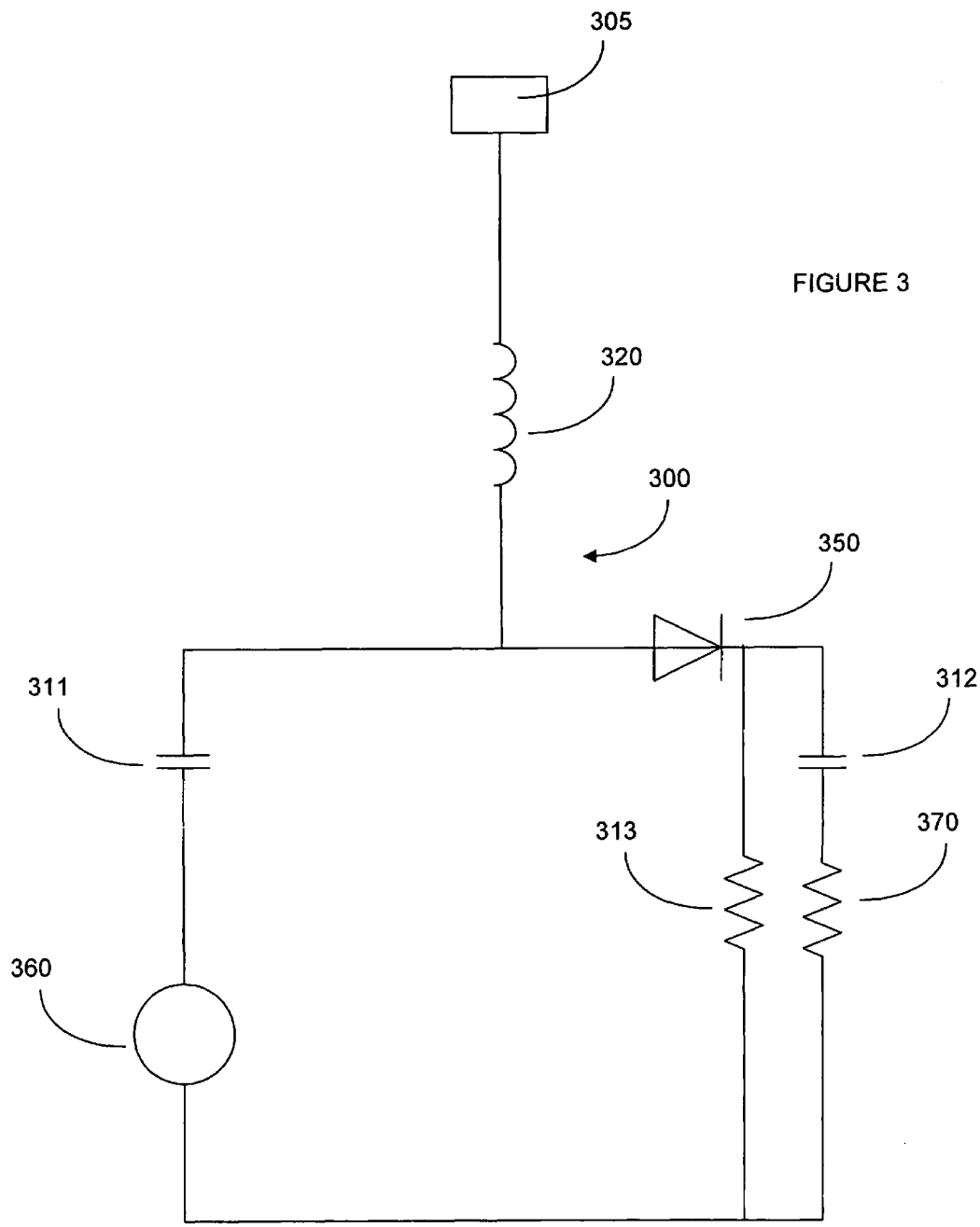
FIG. 3 is a circuit drawing of the PIN diode of FIG. 1 used in a series circuit.

FIG. 3 presents a circuit diagram for the use of a PIN diode in series connected switch circuit 300. PIN diode 350 is in a pass power condition when it is forward biased and presents a low forward resistance between RF generator 360 and load 370. For a stop power condition, diode 350 is at zero, or reverse bias, so that it presents a high impedance between source 360 and load 370. In series connected switches, the maximum isolation attainable depends primarily on the capacitance of the PIN diode, while the insertion loss depends on the diode resistance. Control voltage 305 is applied through RF choke 320 to control the resistance of PIN diode 350. Capacitors 311 and 312 are DC blocking capacitors and resistor 313 is a shunt resistor. Capacitors 311 and 312 isolate load 320 and generator 360 from diode 350.

Figure 4:
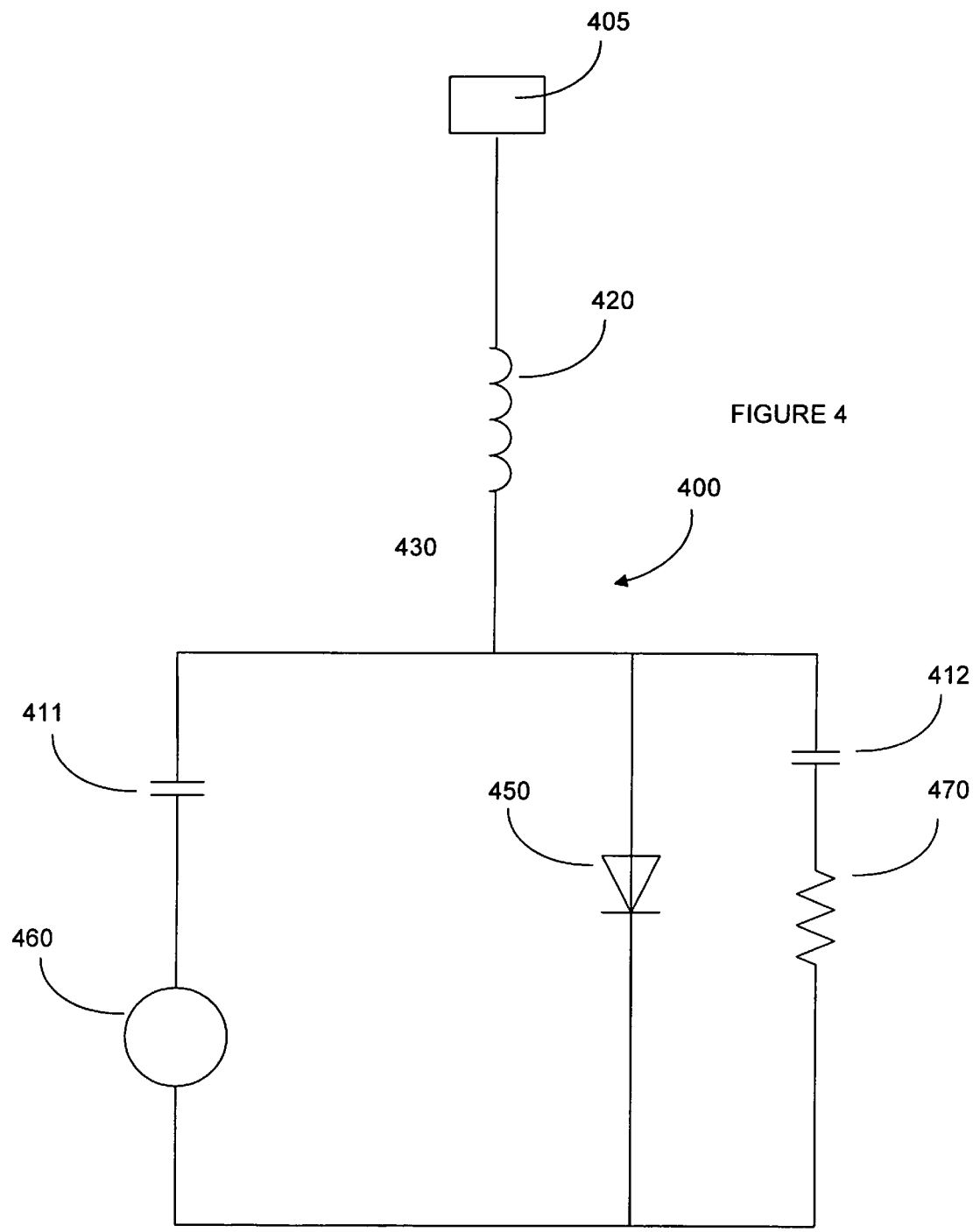
FIG. 4 is a circuit drawing of the PIN diode of FIG. 1 used in a shunt circuit.

FIG. 4 presents a circuit diagram illustrating PIN diode 450 connected between source 460 and load 470 in shunt switch circuit 400. As in the series switch of FIG. 3, control current 405 is applied through RF choke 420 to control the shunt resistance of PIN diode 350. A shunt diode switch offers high isolation for many applications, and since the diode may be heat-sinked at one electrode, it is capable of handling more radio frequency power than a diode in a series type switch. In some switch designs, the isolation and power dissipation are functions of the diode's forward resistance, whereas the insertion loss is primarily dependent on the capacitance of the PIN diode.

Figure 5:
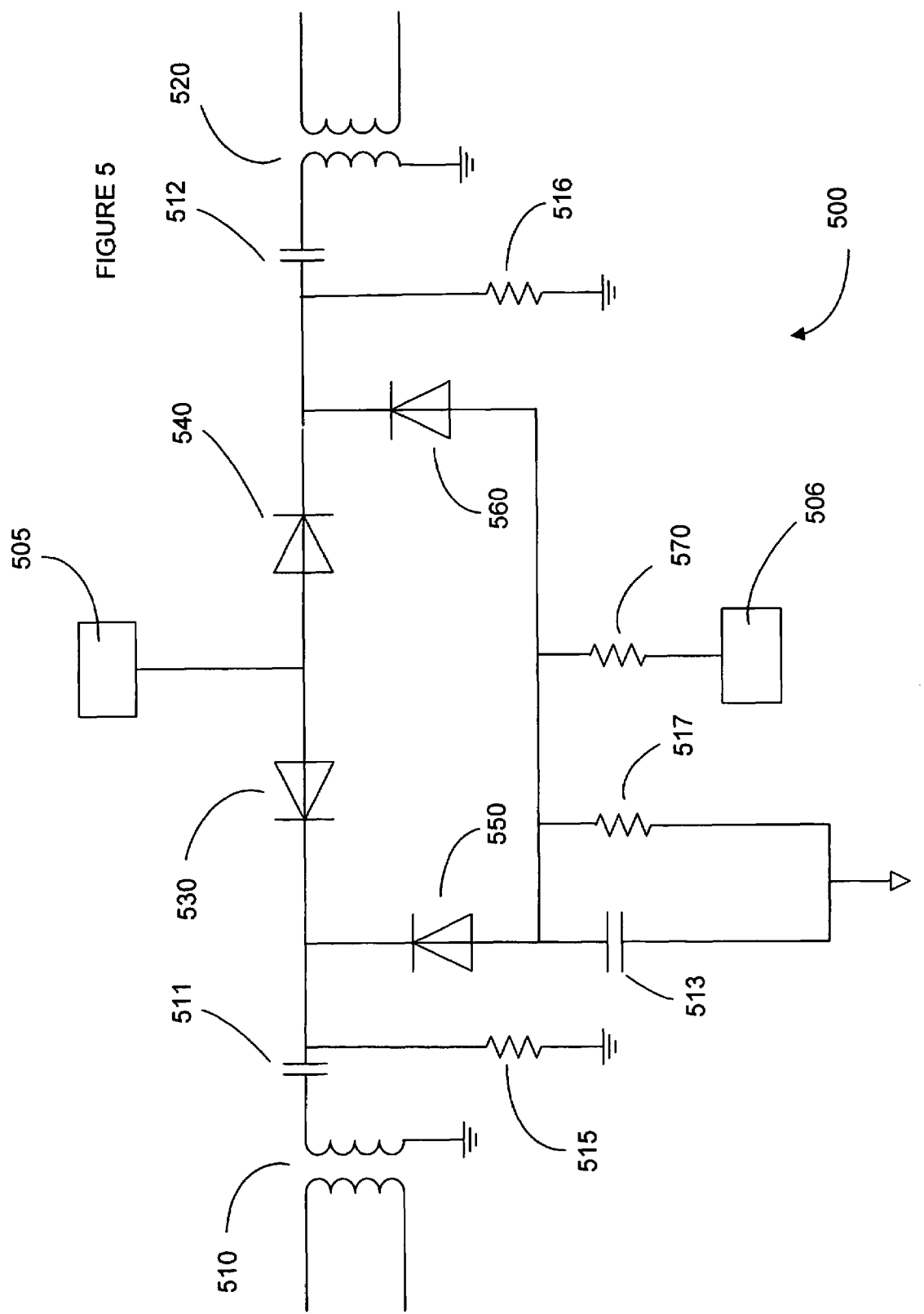
FIG. 5 is a circuit drawing of the PIN diode of FIG. 1 used in a single-ended attenuation circuit.

In an attenuator application, the resistance characteristic of the PIN diode is exploited, not only at its extreme high and low values as in switches, but at the finite values in between. The resistance characteristic of the PIN diode when forward biased depends largely on the width of insulator region 130. PIN diode attenuator circuits are used extensively in automatic gain control (AGC) and RF leveling applications, as well as in electronically controlled attenuators and modulators. A typical configuration of an RF leveling application is shown in FIG. 5. The PIN diode attenuator may take many forms, ranging from a simple series or shunt diode acting as a switch, or a more complex structure that maintains a nearly constant input and output impedance across the full dynamic range of the attenuator. Referring to FIG. 3, the attenuation of the signal generated from generator 360 is controlled by control current 305 applied through RF choke 320. As the current through PIN diode 350 increases, the resistance of PIN diode 350 decreases. Likewise, in FIG. 4, control current 405 applied to PIN diode 450 sets the attenuation level by varying the resistance of diode 450.

FIG. 5 is a circuit drawing illustrating one method of attenuating a differential input signal. A differential input signal is applied to transformer 510 of circuit 500 where it is converted into a single-ended signal. This single-ended signal is applied to an attenuator circuit of PIN diodes. One example of an attenuator circuit uses PIN diodes 530, 540, 550, and 560 as provided in FIG. 5. Diodes 530 and 540 are connected in series with the single-ended input and diodes 550 and 560 are connected in a shunt circuit in regard to the single-ended input. Control current 505 is applied between diodes 530 and 540 to control the resistance of the diode circuit, thereby controlling the attenuation. Voltage divider resistors 517 and 570 connected to DC voltage 506 provide a bias voltage for shunt diodes 550 and 560. The shunt resistance in diodes 550 and 560 creates an impedance match for the input and output to achieve high attenuation. Capacitors 511 and 512 are DC blocking capacitors and resistors 515 and 516 are shunt resistors. Capacitor 513 is an AC filter. After the single-ended input has been attenuated, it is presented to transformer 520 where it is converted back into a differential signal. This conversion from differential to single-ended and back to differential introduces several problems as stated hereinabove.

Figure 6:
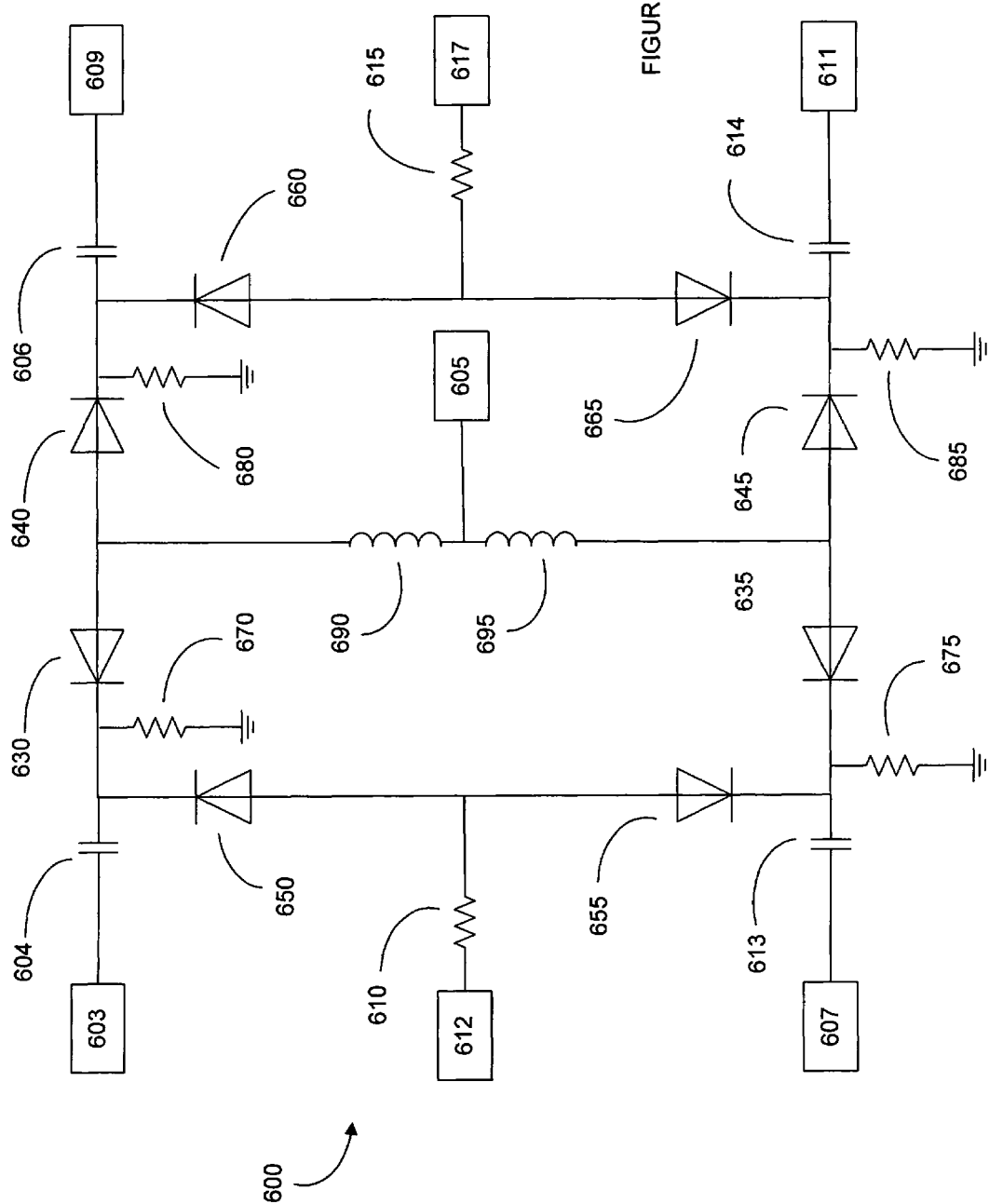
FIG. 6 is a circuit drawing of the PIN diode of FIG. 1 used in a differential attenuation circuit.

FIG. 6 provides a circuit using the single-ended attenuator circuit of FIG. 5 in a differential configuration. This alleviates the conversion problems of the single-ended circuit. One set of four diodes is used to attenuate the positive side of the differential signal and another set of four diodes is used to attenuate the negative side of the differential signal. On the positive side of the differential input 603, resistor 670 establishes a bias voltage. Diodes 630 and 640 are connected in series with output 609 on the positive side, and diodes 650 and 660 are connected in shunt to bias voltage 612 and 617 through resistors 610 and 615 respectively. Capacitors 604, 606, 613, 614 are DC blocking capacitors. On the negative side of the differential input at differential input 607, resistor 675 supplies a bias voltage, diodes 635 and 645 are connected in series with output 611, and diodes 655 and 665 are connected in a shunt to bias voltages 612 and 617 through resistors 610 and 615.

Resistor 680 at output 609 sets a bias voltage and resistor 685 at negative output 611 sets a bias voltage. Attenuation control voltage 605 is supplied to both the positive and negative attenuation circuits through an RF choke. On the positive side, RF choke 690 is electrically connected between series diodes 630 and 640. On the negative side, RF choke 695 is electrically connected between diodes 635 and 645. Both RF chokes 690 and 695 are electrically connected to attenuation control voltage 605. This configuration of the attenuation diode on both the positive and negative side of the differential input signal paths enables a differential attenuation of the signals without converting to a single-ended signal.

Figure 7:
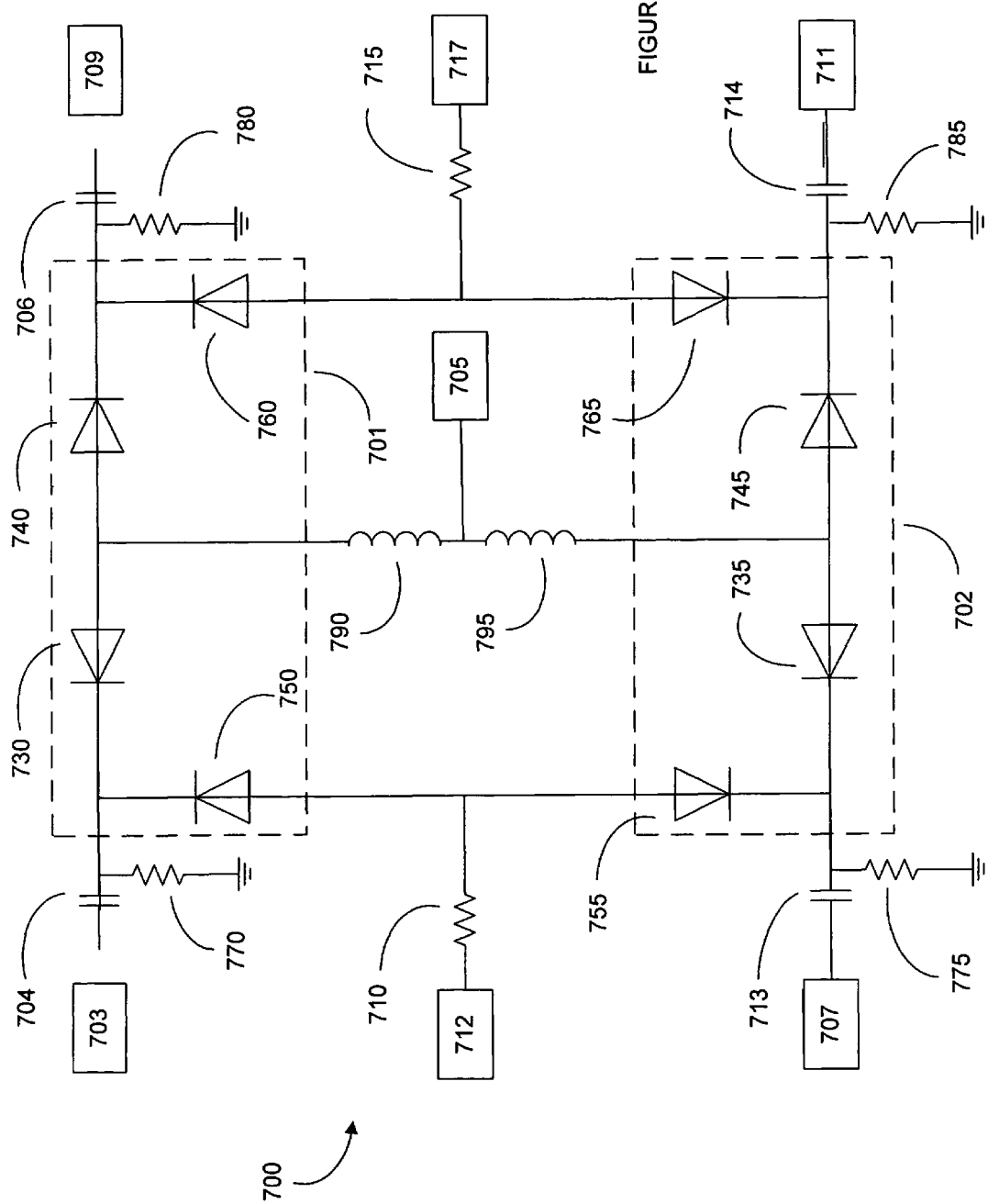
FIG. 7 is a circuit drawing of a differential broadband attenuator using the PIN diodes of FIG. 1.

FIG. 7 demonstrates one method of using sets 701, 702 of a plurality of diodes to achieve differential attenuation. One set of four diodes 701 is used to attenuate the positive side of the differential signal and another set of four diodes 702 is used to attenuate the negative side of the differential signal. On the positive side of the differential input 703, resistor 770 establishes a bias voltage. Diodes 730 and 740 are connected in series with output 709 on the positive side, and diodes 750 and 760 are connected in shunt to bias voltage 712 and 717 through resistors 710 and 715 respectively. On the negative side of the differential input at differential input 707, resistor 775 supplies a bias voltage, diodes 735 and 745 are connected in series with output 711, and diodes 755 and 765 are connected in a shunt to bias voltages 712 and 717 through resistors 710 and 715. Capacitors 704, 706, 713, and 714 are DC blocking capacitors. Resistor 780 at output 709 sets a bias voltage and resistor 785 at negative output 711 sets a bias voltage. Attenuation control voltage 705 is supplied to both the positive and negative attenuation circuits through an RF choke. On the positive side, RF choke 790 is electrically connected between series diodes 730 and 740. On the negative side, RF choke 795 is electrically connected between diodes 735 and 745. Both RF chokes 790 and 795 are electrically connected to attenuation control voltage 705. This configuration of the attenuation diodes on both the positive and negative side of the differential input signal paths enables a differential attenuation of the signals without converting to a single-ended signal.

In one embodiment, diodes 730, 740, 750, and 760 are on the same substrate, on the same die, and diodes 735, 745, 755, and 765 are fabricated on another die, on a different substrate. Diodes 735, 745, 755, and 765 may be on one substrate. In this embodiment, the diodes may be arranged in a plurality of configurations, but the diodes on the positive side of the differential pair and the diodes on the negative side of the differential pair are on different semiconductor dies. The problem with these configurations is that the characteristics of diode 750 and 755, for example, may be different because they are fabricated on different semiconductor dies. Diodes in the set on the positive side may have different characteristics than diodes in the set on the negative side. With a single change in attenuation control voltage 705, a different attenuation may occur from the set of diodes on the positive side than for the set of diodes on the negative side, because each set, or at least a single set of diodes is on a different substrate.

Differential designs of RF systems rely on a balance in the signal power between the positive and negative path for the integrity and performance of the system. Differing amounts of attenuation between the positive and negative paths of the differential attenuator creates unbalanced RF signal levels at the output of the attenuator. This would result in further undesirable characteristics such as an impaired ability to cancel even order harmonic energy in subsequent gain stages.

This problem of the varying characteristics can be ameliorated by the arrangement of the diodes of a particular set. To achieve this, a diode on the positive side of the differential attenuator will have a corresponding diode in the same semiconductor package, and, therefore, on the same die, on the negative side of the differential attenuator. For example, in FIG. 8, one set of four diodes 801 is used to form the front half of the attenuator for both the positive side and negative side of the differential signal and another set of four diodes 802 is used to form the back half of the attenuator for both the positive and the negative side of the differential signal. On the positive side of the differential input 803, resistor 870 establishes a bias voltage. Diodes 830 and 840 are connected in series with output 809 on a positive side, and diodes 850 and 860 are connected in shunt to bias voltage 812 and 817 through resistors 810 and 815 respectively.

Capacitors 804, 806, 813, 814 are DC blocking capacitors. On the negative side of the differential input at differential input 807, resistor 875 supplies a bias voltage, diodes 835 and 845 are connected in series with output 811, and diodes 855 and 865 are connected in shunt to bias voltages 812 and 817 through resistors 810 and 815. Resistor 880 at output 809 sets a bias voltage, and resistor 885 at negative output 811 sets a bias voltage. Attenuation control voltage 805 is supplied to both the positive and negative attenuation circuits through RF chokes. On the positive side, RF choke 890 is electrically connected between series diodes 830 and 840. On the negative side, RF choke 895 is electrically connected between diodes 835 and 845. Both RF chokes 890 and 895 are electrically connected to attenuation control voltage 805. This configuration of the attenuation diode on both the positive and negative side of the differential input signal paths enables a differential attenuation of the signals without converting to a single-ended signal.

To describe this in more detail, diode 850, which is the shunt diode on the input side of the positive differential attenuator, and diode 855, the shunt diode on the negative side of the input of the differential attenuator, are on the same die, in the same semiconductor package. It is not necessary for the diodes to be contained in a package as long as they are contained on the same die. Likewise, diode 830 and 835 are on the same die, in the same semiconductor package. Diode 840 and 845 are on the same die, in the same semiconductor package, and diode 860 and 865 are on the same die, in the same semiconductor package.

Figure 8:
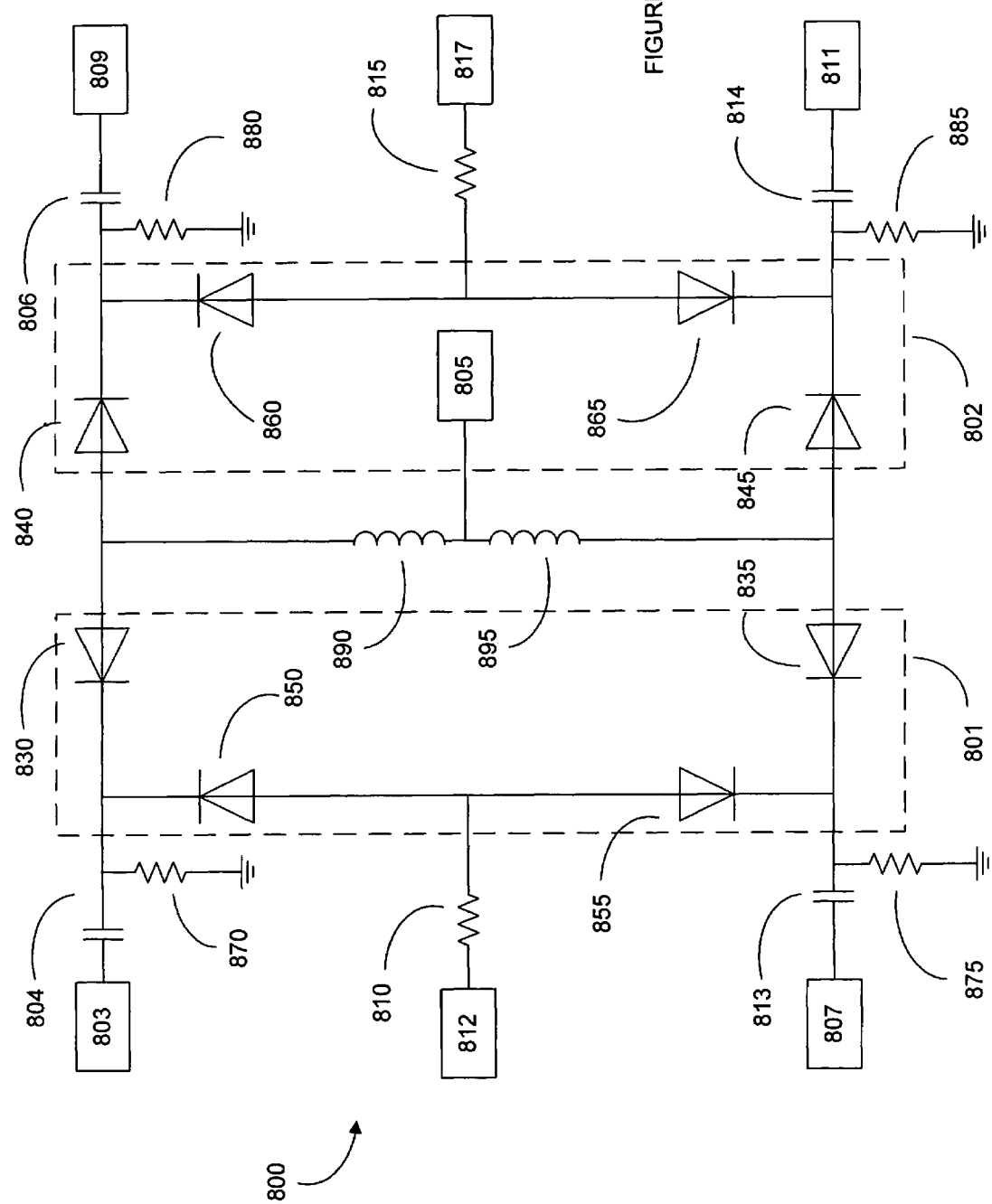
FIG. 8 is a circuit drawing of a differential attenuator using PIN diodes of FIG. 1.

As shown in FIG. 8, a preferred embodiment of set 801 comprises diodes 830, 850, 835, and 855. A preferred embodiment of set 802 comprises diodes 840, 860, 845, and 865. The circuit shown in FIG. 8 provides 4 diodes on the same die. However, the circuit applies to dies with any number of diodes fabricated thereon, as long as a diode on the die used on the positive side of the differential pair has a corresponding diode on the die used on the negative side of the differential pair. Additionally, each positive-side diode on one die should have a corresponding negative-side diode with the same function on the same die. With the devices arranged in this manner, the attenuation characteristics will be substantially similar on both the positive and negative sides of the differential attenuator. Two like devices on the same semiconductor die will exhibit substantially similar characteristics, including forward voltage, distortion, etc. In this manner, the differential attenuator can achieve substantially similar attenuation on both the positive and negative side of the differential pair.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

Therefore, at least the following is claimed:

1. A system for attenuating a differential signal comprising:
    a differential input comprising a positive side and a negative side;
    a differential output comprising a positive side and a negative side;
    a plurality of semiconductor dies electrically connected between the differential input and differential output; and
    a plurality of attenuation devices fabricated on each of the plurality of semiconductor dies, such that a semiconductor die comprising an attenuation device electrically connected between the differential input and the differential output on the positive side further comprises a complimentary attenuation device between the differential input and the differential output on the negative side.

2. The system of claim 1, wherein at least one of the attenuation devices comprises a variable attenuation device.

3. The system of claim 1, wherein at least one attenuation device comprises a broadband attenuation device.

4. A system for attenuating a differential signal comprising;
    a differential input comprising a positive side and a negative side;
    a differential output comprising a positive side and a negative side;
    a plurality of semiconductor dies electrically connected between the differential input and differential output;
    a plurality of attenuation devices fabricated on each of the plurality of semiconductor dies, such that a semiconductor die comprising an attenuation device electrically connected between the differential input and the differential output on the positive side further comprises a complimentary attenuation device between the differential input and the differential output on the negative side, wherein at least one of the attenuation devices comprises a variable attenuation device;
    wherein at least one of the plurality of semiconductor dies comprises:
    an attenuation device electrically connected in series with the differential input and differential output on the positive side;
    an attenuation device electrically connected in series with the differential input and differential output on the negative side;
    an attenuation device electrically connected between the positive side and a variable control input; and
    an attenuation device electrically connected between the negative side and the variable control input.

5. The system of claim 1, wherein at least one attenuation device comprises a PIN diode.

6. A QAM modulator comprising:
    a differential input comprising a positive side and a negative side;
    a differential output comprising a positive side and a negative side;
    a plurality of semiconductor dies electrically connected between the differential input and differential output; and
    a plurality of attenuation devices fabricated on each of the plurality of semiconductor dies, such that a semiconductor die comprising an attenuation device electrically connected between the differential input and the differential output on the positive side further comprises a complimentary attenuation device between the differential input and the differential output on the negative side.

7. The system of claim 6, wherein at least one attenuation device comprises a PIN diode.

8. The system of claim 7, wherein at least one of the attenuation devices comprises a variable attenuation device.

9. The system of claim 7, wherein at least one of the attenuation devices comprises a broadband attenuation device.

10. The system of claim 7, wherein at least one of the plurality of semiconductor dies comprises:
   an attenuation device in series with the differential input and differential output on the positive side;
   an attenuation device in series with the differential input and differential output on the negative side;
   an attenuation device between the positive side and a variable control input; and
   an attenuation device between the negative side and the variable control input.

11. The system of claim 2, further comprising an attenuation control voltage, wherein the attenuation of the at least one variable attenuation device varies as a function of the attenuation control voltage.

12. The system of claim 1, further comprising:
   a first radio frequency (RF) choke electrically connected between the differential input and the differential output on the positive side; and
   a second RF choke electrically connected between the differential input and the differential output on the negative side.

13. The system of claim 12, wherein the plurality of the attenuation devices comprises first and second variable attenuation devices, the system further comprising:
   an attenuation control voltage that is supplied to the first variable attenuation device through the first RF choke and is supplied to the second variable attenuation device through the second RF choke, wherein the attenuation of the first and second variable attenuation devices varies as a function of the attenuation control voltage.

14. The system of claim 1, further comprising:
   a first direct current (DC) blocking capacitor electrically connected between the differential input and the differential output on the positive side; and
   a second DC blocking capacitor electrically connected between the differential input and the differential output on the negative side.

15. A system for attenuating a differential signal comprising:
   a differential input comprising a positive side and a negative side;
   a differential output comprising a positive side and a negative side;
   a plurality of semiconductor dies electrically connected between the differential input and differential output; and
   a differential attenuator comprising a plurality of PIN diodes devices arranged to attenuate the differential signal and are fabricated on each of the plurality of semiconductor dies, such that each of the plurality of semiconductor dies comprises at least one pair of complimentary PIN diodes electrically connected between the differential input and the differential output on the positive side and on the negative side.

* * * * *